United States Patent [19]
Hill

[11] Patent Number: 6,043,698
[45] Date of Patent: Mar. 28, 2000

[54] VOLTAGE LEVEL SHIFTER

[75] Inventor: Stephen John Hill, Austin, Tex.

[73] Assignee: ARM Limited, Cambridge, United Kingdom

[21] Appl. No.: 08/963,067

[22] Filed: Nov. 3, 1997

[51] Int. Cl.[7] .................................................... H03L 5/00
[52] U.S. Cl. ............................... 327/333; 326/81; 326/63
[58] Field of Search ............................. 327/333; 326/80, 326/81, 68, 62, 63

[56] References Cited

U.S. PATENT DOCUMENTS

| 4,656,373 | 4/1987 | Plus .............................................. 326/81 |
| 4,978,870 | 12/1990 | Chen et al. ................................. 326/68 |
| 5,136,190 | 8/1992 | Chern et al. ............................... 326/81 |
| 5,204,557 | 4/1993 | Nguyen .................................... 326/81 |
| 5,578,957 | 11/1996 | Erhart et al. ............................. 327/333 |
| 5,896,045 | 4/1999 | Siegel et al. .............................. 326/81 |

*Primary Examiner*—Kenneth B. Wells
*Assistant Examiner*—Hai L. Nguyen
*Attorney, Agent, or Firm*—Nixon & Vanderhye P.C.

[57] ABSTRACT

The present invention provides a voltage level shifter for use in a digital circuit having a low voltage portion and a high voltage portion. The voltage shifter comprises an interface circuit 20,32,60 that senses transitions in a low voltage digital signal from an old value to a new value and uses these to trigger latching of the new value. The latch can be a SR latch 34,62 with its set 40 and reset 42 inputs coupled to pulse generators 46,68,58,70 respectively responsive to rising and falling edges in the input low voltage signal being passed from the low voltage portion to the high voltage portion. Feedback from the output on the latch 62 can be controlled to limit the duration of the pulses from the pulse generators 68,70 and thereby reduce power consumption due to the dc current leakage associated with a low voltage to high voltage signal interface.

8 Claims, 5 Drawing Sheets

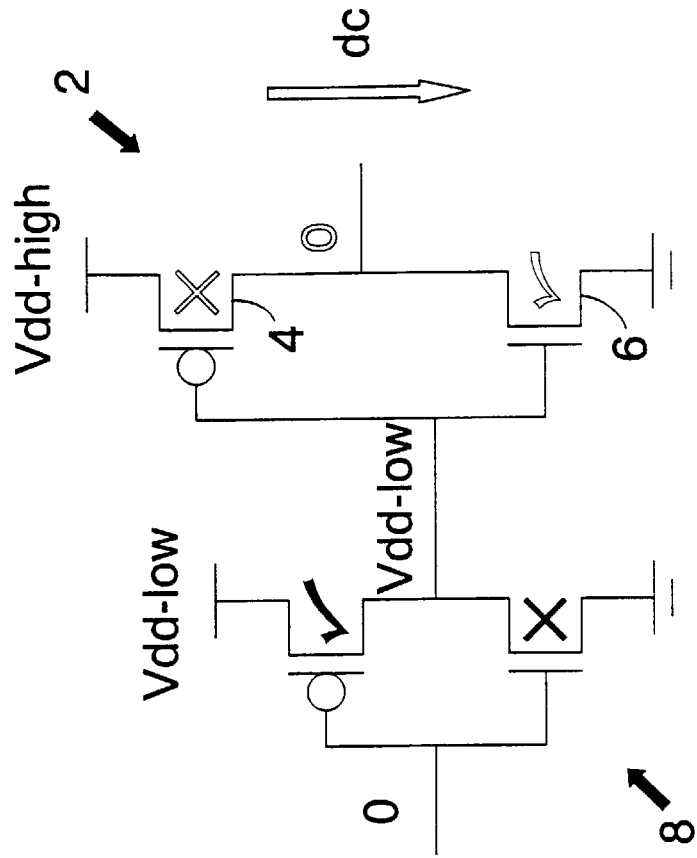
Fig.1A -- Prior Art --
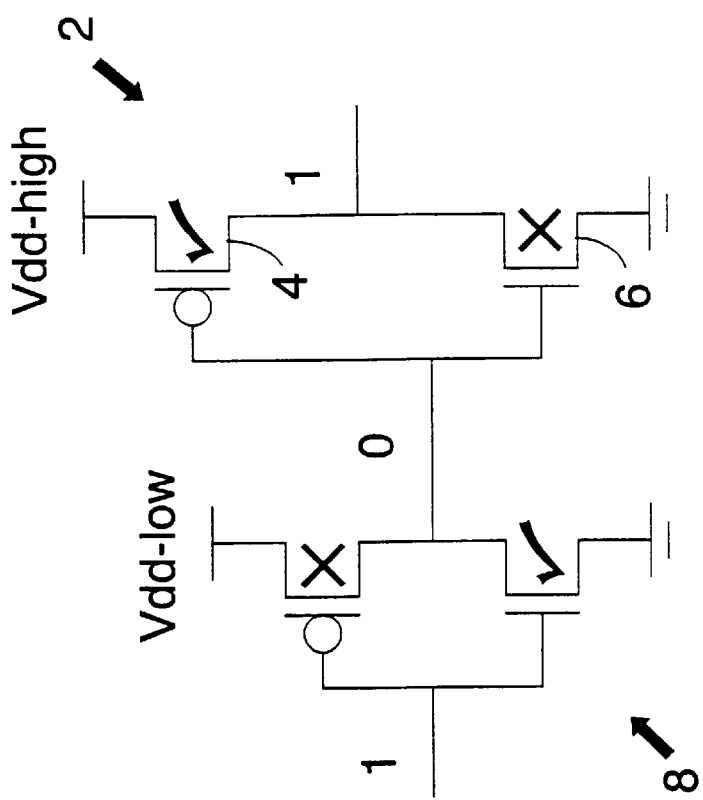
Fig.1B -- Prior Art --

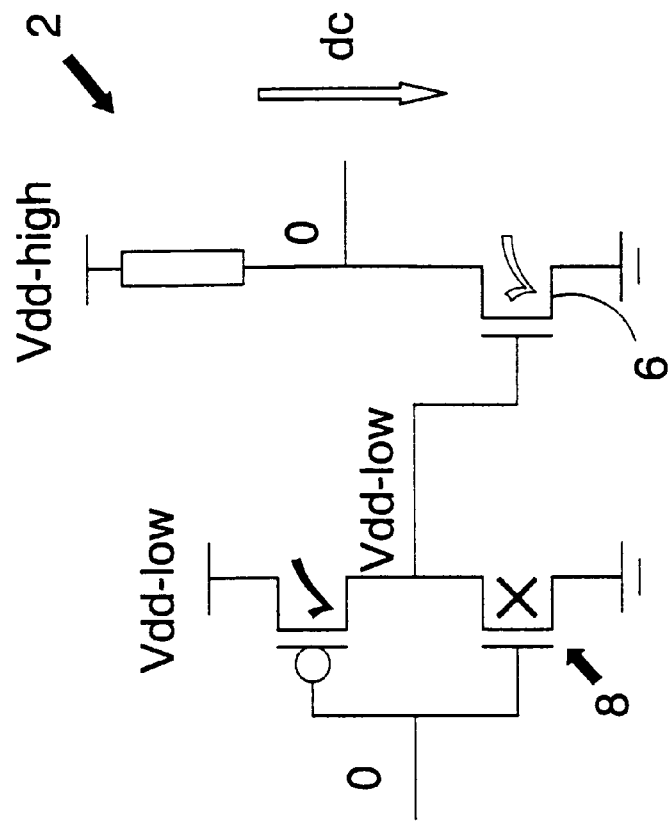
*Fig. 2B* --Prior Art--
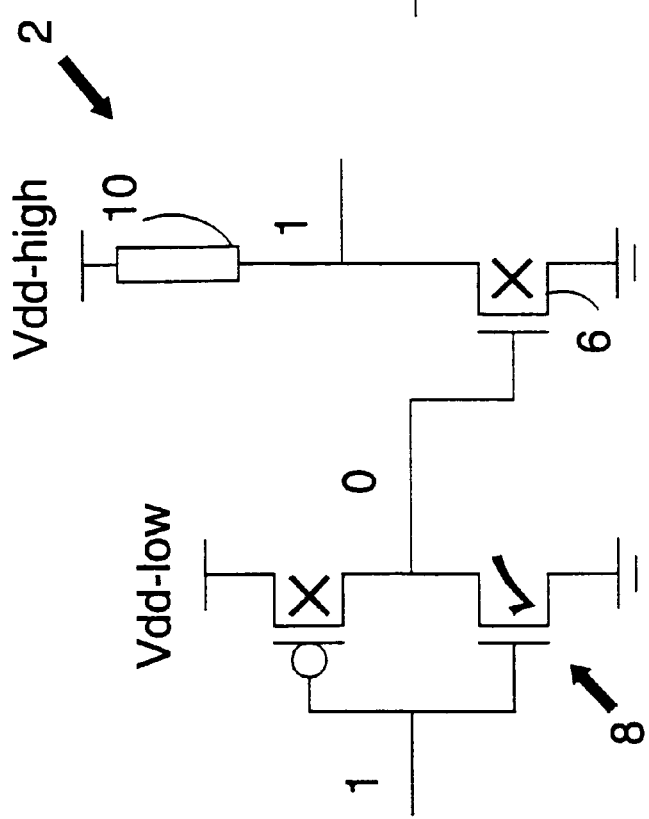
*Fig. 2A* --Prior Art--

VOLTAGE LEVEL SHIFTER

BACKGROUND OF THE INVENTION

1. Field of the Invention

The present invention relates to digital circuits. More particularly, the present invention relates to digital circuits having a low voltage portion and a high voltage portion between which it is desired to pass digital signals.

2. Description of the Prior Art

It is known in the field of digital circuits to provide digital circuits with an interface circuit between a low voltage portion and a high voltage portion. FIGS. 1A, 1B, 2A and 2B of the accompanying drawings show examples of such interface circuits.

FIGS. 1A and 1B show an example of an interface circuit taking the simple form of an invertor 2 composed of a p-type transistor 4 and an n-type transistor 6. The signal from the low voltage portion is first passed to a buffer in the form of an invertor 8 that serves to ensure the digital signal being passed to the high voltage portion is either at the ground voltage level or at the low voltage supply level Vdd-low. When the digital signal input to the transistors 4, 6 is a "0", as shown in FIG. 1A, then transistor 4 is fully switched on whilst transistor 6 is fully switched off leading to an output value of "1" with substantially no dc current flowing through the transistors 4,6.

FIG. 1B shows the situation in which the signal applied to the inputs of the transistors 4, 6 is the low voltage supply level Vdd-low. This input signal is insufficient in level to filly switch off transistor 4 or fully switch on transistor 6. As a result the desired output of "0" is not reliably produced since the transition voltages of the transistors 4,6 may not be adequately cleared by the input signal level. Furthermore, a dc current path is present through the partially switched on transistors 4,6. This dc current flow is a severe disadvantage since it wastes a considerable amount of power.

FIG. 2A illustrates a modified interface circuit using a pull up resistor 10 in place of the p-type transistor 4 of FIGS. 1A and 1B. In the case illustrated in FIG. 2A, the input value to the interface circuit 2 is a "0" and again fully switches off the transistor 6 producing an output value of "1" having the full high voltage supply level Vdd-high. In the case illustrated in FIG. 2B, the transistor 6 is again not completely switched on by the signal Vdd-low, but in this case the value of the resistor 10 can be chosen to be significantly higher than the resistance of the transistor 6 in this partially switched on state such that the output from the interface circuit 2 is reliably at a level of "0" in this circumstance. (The resistor element may be a tied of transistor or alternatively could a weak p-type transistor sharing its gate input with the n-type transistor.) However, the problem of the dc current path still persists and is a severe disadvantage.

In modern digital circuits it is desired to run different portions of the the circuit at different voltage levels to save power, but the number of signals that must be passed from the low voltage portion to the high voltage portion can be very large and so the number of interface circuits will be correspondingly large. If each of these interface circuits wastes power through the above dc current, then the total power loss is significant.

SUMMARY OF THE INVENTION

An object of the present invention is to address the above problems.

According to one aspect, the present invention provides a digital circuit comprising:

(i) a low voltage portion operating with digital signal voltage values being one of a first value and a second value;

(ii) a high voltage portion operating with a digital signal voltage values being one of a third value and a fourth value, a difference between said fourth value and said third value being greater than a difference between said second value and said first value; and (iii) an interface circuit for passing low voltage digital signal from said low voltage portion to said high voltage portion; wherein (iv) said interface circuit senses a transition in said low voltage digital signal from an old value to a new value to trigger a latch within a high voltage side of said interface circuit to store a value corresponding to said new value and being one of said third value and said fourth value.

The making of the interface circuit responsive to transitions in the low voltage digital signal to trigger latching of the signal allows the high voltage portion to be isolated from the low voltage portion so as not to be dependent upon the level of a low voltage signal to hold any element in the high voltage portion in a particular switched state. For the duration of the transition and latching operation there will be such a dependence that can suffer from the problem that the low voltage signals cannot fully switch the high voltage components, but the power wasted is limited to only the duration of the transition and latching operation. Furthermore, since the transition is sensed and used to trigger the output latch without any external timing signals being required, the interface circuit is essentially self-timed. The self-timed nature of the interface circuit is a significant advantage to maintain since it avoids the introduction of additional delay into the signal path that would be associated with a clocked scheme.

In preferred embodiments of the invention using first and second pulse signals passed from the low to the high voltage portions to respectively trigger storage by the latch of the third and fourth values has the advantage of further reducing power by reducing the number of signals that need to be passed across the voltage interface with the inherent power loss penalty that is incurred.

It will be appreciated that the operating voltage ranges of the low voltage portion and the high voltage portion could have many different relationships. However, in preferred embodiments of the invention said first value and said third value are a common ground voltage. The use of such a common ground voltage between the different portions of the digital circuit significantly simplifies the design.

In order to make the interface circuit produce reliable output values and reduce its power consumption in preferred embodiments of the invention said interface circuit includes at least one sensing circuit comprising a pull up resistor element, a switching transistor and a sensing transistor connected in series between a point at said fourth voltage and a point at said third voltage, said sensing transistor being switched between states by a signal from said low voltage portion having said first value or said second value and said switching transistor being temporarily switched to a conductive state in response to a pulse signal generated by said transition.

The above arrangement provides the desired pull up properties and switching properties to improve the performance of the interface circuit whilst being advantageously compact and simple. It will be understood that the resistor element may typically be formed of a comparatively long transistor with a tied off gate so as to provide the characteristics of a simple resistor or a weak and partially switched transistor.

In order to respond to the transitions in the low voltage digital signal and control the above interface circuit to switch at the correct times, it is preferred that said interface circuit includes an edge detector responsive to said transition to generate said pulse signal.

A particularly preferred embodiment that provides the desired improved performance reliably and with advantageously compact and simple circuitry is one in which said latch is an SR latch and said interface circuit includes two of said sensing circuits arranged to respectively provide set and reset inputs to said SR latch.

It will be understood that the unwanted dc current path is temporarily present during the period that the pulse signal is asserted. Accordingly, preferred embodiments of the invention are such that a pulse signal is generated in response to said transition, said pulse signal having a pulse duration controlled by feedback from said latch indicating said new value has been stored by said latch.

In this way the pulse signal period can be controlled to be closer to the minimum that is required for the latch to correctly store the new value and so the power wasted in coupling the low voltage portion to the high voltage portion is reduced. Furthermore, this feedback does not in itself suffer from the above described problems of passing a signal between voltage domains. More particularly, the above problems are associated with going from the low voltage side to the high voltage side. The reverse situation does not give rise to the same problems as a high voltage signal is more than capable of fully switching on a transistor operating in the low voltage domain.

Whilst the present invention could be used in any form of digital circuit, it is particularly suited for use in integrated circuits. It is often in the field of integrated circuits that the desire to reduce power consumption and avoid signal propagation delays by the technique of the present invention are strong.

The invention is also of great utility in embodiments in which said integrated circuit includes a central processing unit core. The presence of a central processing unit core is typically accompanied by considerable complexity within the digital circuit which if it has high and low voltage domains will generally mean that a large number of digital signals will have to be passed from the low voltage side to the high voltage side resulting in considerable power consumption and unreliability without the use of the present invention.

Viewed from another aspect the present invention provides a method of operating a digital circuit, said method comprising the steps of:

(i) operating a low voltage portion with digital signal voltage values being one of a first value and a second value;

(ii) operating a high voltage portion with a digital signal voltage values being one of a third value and a fourth value, a difference between said fourth value and said third value being greater than a difference between said second value and said first value; and (iii) passing low voltage digital signal from said low voltage portion to said high voltage portion via an interface circuit; wherein (iv) sensing, with said interface circuit, a transition in said low voltage digital signal from an old value to a new value to trigger a latch within a high voltage side of said interface circuit to store a value corresponding to said new value and being one of said third value and said fourth value.

BRIEF DESCRIPTION OF THE DRAWINGS

The present invention will be described, further by way of example only, with reference to a preferred embodiment thereof as illustrated in the accompanying drawings, in which:

FIGS. 1A, 1B, 2A and 2B illustrate the problems that can arise with interface circuits for passing digital signals from a low voltage portion to a high voltage portion of the digital circuit;

DESCRIPTION OF A PREFERRED EMBODIMENT

Figure 3:
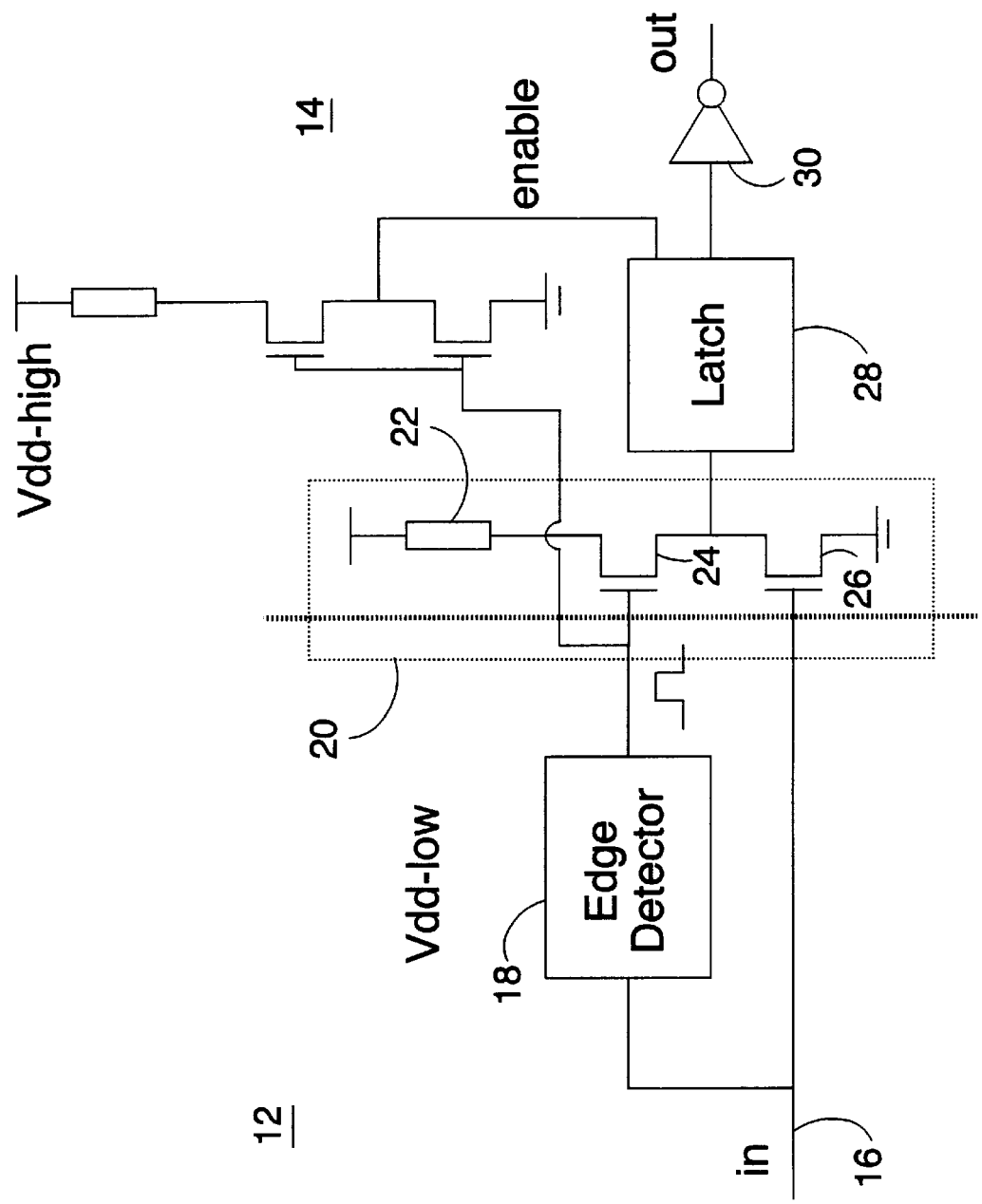
FIG. 3 illustrates a first embodiment of an improved interface circuit.

FIG. 3 shows a digital circuit having a low voltage portion 12 and a high voltage portion 14. A low voltage digital signal on the input line 16 needs to be passed from the low voltage portion 12 to the high voltage portion 14. An edge detector circuit 18 (which can have several known forms) serves to generate a pulse signal giving a temporary "0-1-0" output in response to either a rising edge or a falling edge in the signal of the input line 16.

The interface circuit 20 includes a resistor element 22, a switching transistor 24 and a sensing transistor 26 all connected in series between the high supply voltage Vdd-high and ground (it will be appreciated that the transitors could be in a different order without altering the basic operation of the system). The output from the edge detector 18 serves to temporarily switch on the switching transistor 24 whenever a transition is detected on the input line 16. When the switching transistor 24 is switched on, the output from the sensing transistor 26 to a latch 28 becomes responsive to the signal value on the input line 16. When the signal on the input line 16 is high, the sensing transistor 26 is at least partially switched on and so in combination with the resistor element 22 (serving as a pull up), the output to the latch 28 becomes low. The pulse signal from the edge detector 28 is also passed to the enable input of the latch 18 (via its own voltage interface pull up stage of a resistor element and an n-type transistor with its own associated dc current path) and so the transition in the signal of the input line 16 serves to trigger the latch 28 to store the output from the sensing transistor 26. During the period whilst the pulse signal is asserted, a dc path exists through the interface circuit 20. However, when the pulse signal is finished, the switching transistor 24 switches off blocking the dc path and so reducing unwanted power consumption. Furthermore, it will be seen that the interface circuit 20 is not dependent upon any external timing signals and so does not introduce any disadvantageous timing dependence or signal propagation bottlenecks that would be associated with waiting for a clock edge. The invertor 30 on the output of the latch 28 serves to restore the signal passed by the interface circuit 20 to the same polarity as the signal on the input line 16.

Figure 4:
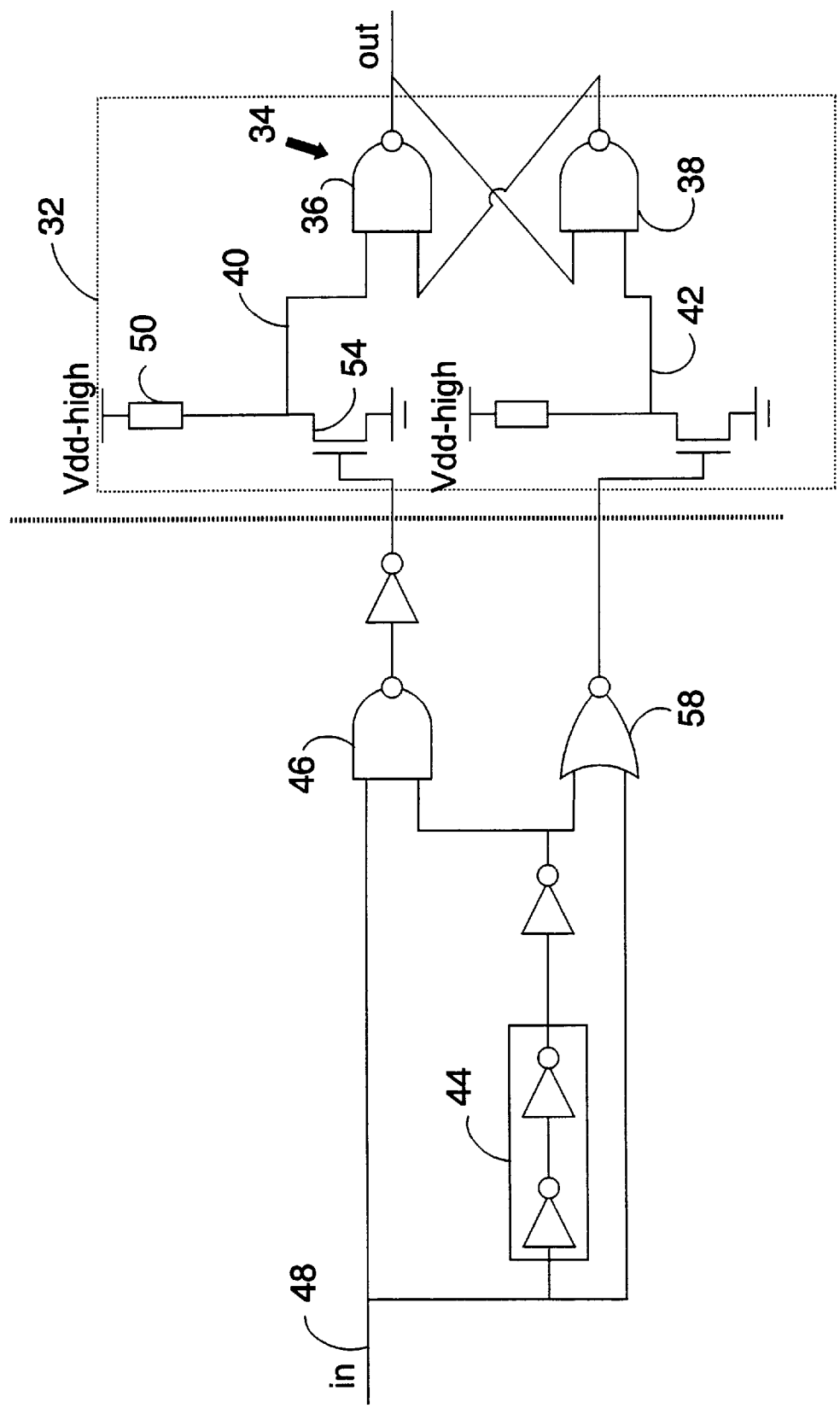
FIG. 4 illustrates a second embodiment of an improved interface circuit using an SR latch.

FIG. 4 shows an interface circuit 32 incorporating a SR latch 34 composed of two NAND gates 36,38. This SR latch 34 is supplied with a set signal via set signal line 40 and a reset signal via reset signal line 42.

A delay element 44 operates with a NAND gate 46 to generate a short "0-1-0" pulse when a rising edge occurs on an input signal line 48 from the low voltage portion of the digital circuit. The duration of the pulse is determined by the length of the delay introduced by the delay element 44. The output from the NAND gate 46 serves to provide the set input to the SR latch 34 via a transistor stack composed of a pull up resistor element 50 (possibly a tied off weak p-type transistor) and a sensing transistor 54. The transistor stack temporarily passes a dc current, but it persists only for the duration of the pulse from the NAND gate 46.

The delay element 44 operates with a NOR gate 58 to generate a "0-1-0" pulse when a falling edge occurs on the input signal line 48. This pulse from the NOR gate 58 supplies the reset input to the SR latch 32 via a transistor stack of the same form as for the set input.

Thus, in operation a rising edge on the input signal line causes a short pulse to the set input of the SR latch 34 causing it to adopt a high output state. A falling edge on the input signal line 48 causes the SR latch 34 to adopt a low output state.

Figure 5:
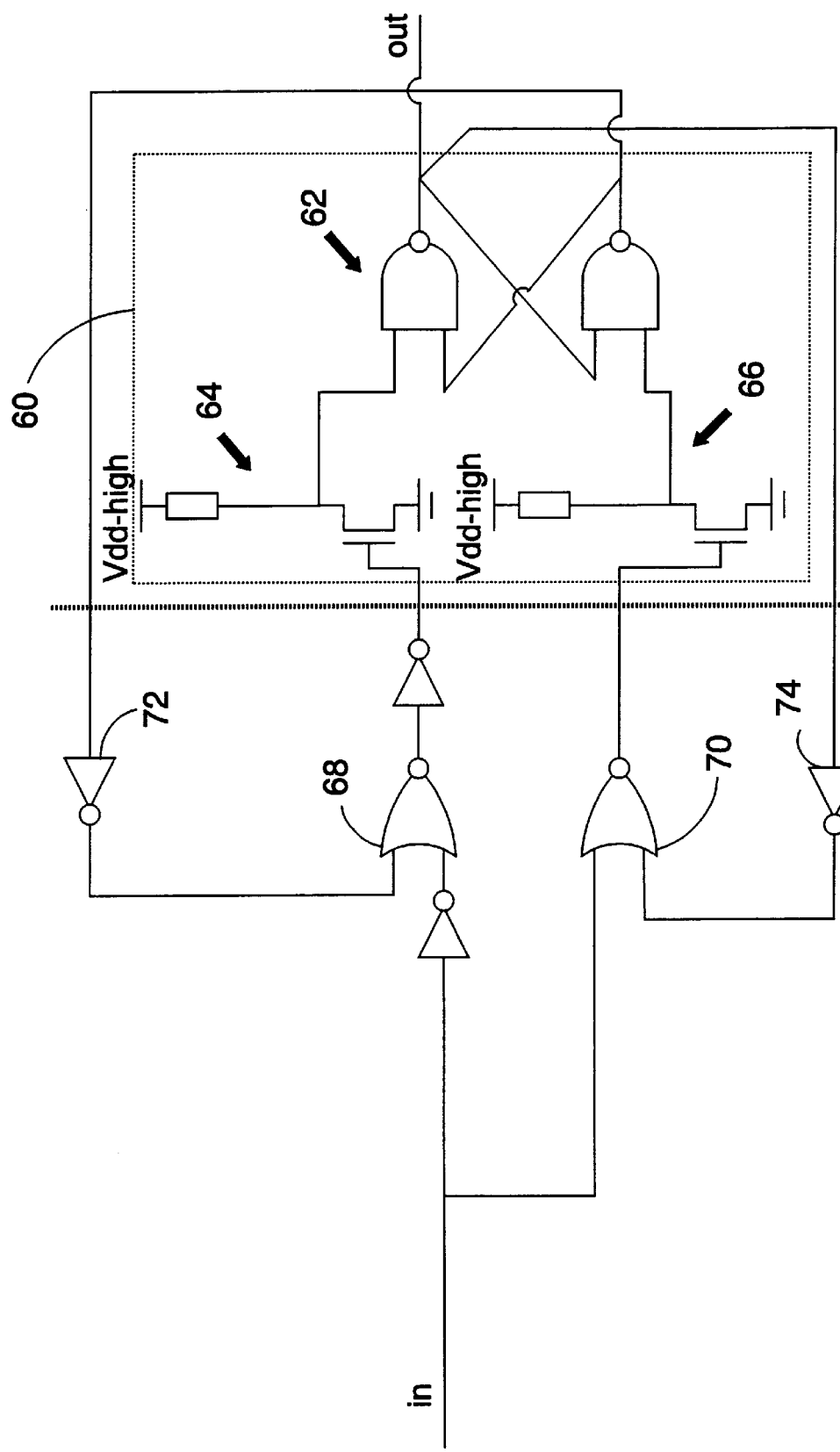
FIG. 5 illustrates a third embodiment of an improved interface circuit using feedback to control the pulse signal width.

FIG. 5 illustrates an interface circuit 60 incorporating a SR latch 62 using similar transistor stacks 64,66 as its set and reset inputs respectively. In this embodiment, feedback is provided from the output of the SR latch 62 to two NOR gates 68,70 that respectively serve as a set pulse generator on a rising edge of the input low voltage signal and a reset pulse generator on a falling edge of the input low voltage signal. The duration of the pulses generated by these two NOR gates 68,70 is controlled by the feedback path via the invertors 72,74. Thus, the pulses last only as long as necessary for the SR latch 62 to store the new signal value and for this to be fedback to the pulse generators and thereafter the transistor stacks 64,66 are fully switched off. This further reduces the power consumption of the system.

Although a particular embodiment of the invention has been described herewith, it will be apparent that the invention is not limited thereto, and that many modifications and additions may be made within the scope of the invention. For example, various combinations of the features of the following dependent claims could be made with the features of the independent claims without departing from the scope of the present invention.

I claim:

1. A digital circuit comprising:
    (i) a low voltage portion outputting digital signal voltage values being one of a first value and a second value;
    (ii) a high voltage portion receiving a digital signal voltage values being one of a third value and a fourth value, a difference between said fourth value and said third value being greater than a difference between said second value and said first value; and
    (iii) an interface circuit for passing a low voltage digital signal from said low voltage portion to said high voltage portion; wherein
    (iv) said interface circuit senses a transition in said low voltage digital signal from said first value to said second value to trigger a latch within said high voltage portion to store a value corresponding to said second value and being one of said third value and said fourth value; and
    (v) a pulse signal being a transition from one of said first and second values to another of said first and second values and return to said one of said first and second values and is generated in response to said transition, said pulse signal having a pulse duration controlled by feedback from said latch indicating said second value has been stored by said latch.

2. A digital circuit as claimed in claim 1, wherein said first value and said third value are a common ground voltage.

3. A digital circuit as claimed in claim 1, wherein said latch is an SR latch, said SR latch having a set input and a reset input and said interface circuit includes two sensing circuits, a first sensing circuit arranged to provide a first input signal to said set input and a second sensing circuit arranged to provide a second input signal to said reset input.

4. A digital circuit as claimed in claim 1, wherein said digital circuit is an integrated circuit.

5. A digital circuit as claimed in claim 4, wherein said integrated circuit includes a central processing unit core.

6. A method of operating a digital circuit, said method comprising the steps of:
    (i) outputting from a low voltage portion a digital signal voltage value being one of a first value and a second value;
    (ii) receiving with a high voltage portion a digital signal voltage value being one of a third value and a fourth value, a difference between said fourth value and said third value being greater than a difference between said second value and said first value;
    (iii) passing a low voltage digital signal from said low voltage portion to said high voltage portion via an interface circuit;
    (iv) sensing, with said interface circuit, a transition in said low voltage digital signal from said first value to said second value to trigger a latch within said high voltage portion to store a value corresponding to said second value and being one of said third value and said fourth value; and
    (v) a pulse signal being a transition from one of said first and second values to another of said first and second values and return to said one of said first and second values and is generated in response to said transition, said pulse signal having a pulse duration controlled by feedback from said latch indicating said second value has been stored by said latch.

7. A digital circuit comprising:
    (i) a low voltage portion outputting digital signal voltage values being one of a first value and a second value;
    (ii) a high voltage portion receiving a digital signal voltage values being one of a third value and a fourth value, a difference between said fourth value and said third value being greater than a difference between said second value and said first value; and
    (iii) an interface circuit for passing a low voltage digital signal from said low voltage portion to said high voltage portion; wherein
    (iv) said interface circuit senses a transition in said low voltage digital signal from said first value to said second value to trigger a latch within said high voltage portion to store a value corresponding to said second value and being one of said third value and said fourth value,
    wherein a pulse signal is generated in response to said transition, said pulse signal having a pulse duration controlled by feedback from said latch indicating said second value has been stored by said latch.

8. A digital circuit as claimed in claim 1, wherein a first pulse signal, being a transition from said first value to said second value and return to said first value, triggers said latch to store said third value and a second pulse signal, being a transition from said second value to said first value and return to said second value, triggers said latch to store said fourth value.

* * * * *